United States Patent [19]

Byczkowski

[11] 4,008,486

[45] Feb. 15, 1977

[54] COMPRESSION-ASSEMBLED SEMICONDUCTOR DEVICE WITH NESTING CIRCULAR FLANGES AND FLEXIBLE LOCATING RING

[75] Inventor: Mieczyslaw W. Byczkowski, Rancho Palos Verdes, Calif.

[73] Assignee: International Rectifier Corporation, Los Angeles, Calif.

[22] Filed: June 2, 1975

[21] Appl. No.: 582,610

[52] U.S. Cl. .................................. 357/74; 357/79; 357/81; 174/52 P; 174/50.63; 361/433

[51] Int. Cl.² ................. H01L 23/02; H01L 23/12; H01L 23/42; H01L 23/44

[58] Field of Search ..................... 357/74, 79, 81; 317/230; 174/52 P, 50.63

[56] References Cited

UNITED STATES PATENTS

| | | | |
|---|---|---|---|
| 2,960,639 | 11/1960 | Tipple | 357/74 |
| 3,058,209 | 10/1962 | Nijhuis et al. | 357/74 |
| 3,337,678 | 8/1967 | Stelmak | 357/74 |
| 3,443,168 | 5/1969 | Camp et al. | 357/79 |
| 3,499,095 | 3/1970 | Haus | 174/52 P |
| 3,654,529 | 4/1972 | Lord | 357/79 |
| 3,721,867 | 3/1973 | Schierz | 357/79 |
| 3,831,067 | 8/1974 | Wislocky et al. | 357/74 |
| 3,918,147 | 11/1975 | Herczog | 317/230 |

FOREIGN PATENTS OR APPLICATIONS 1,459,516  10/1966  France .................................. 357/74

*Primary Examiner*—Andrew J. James
*Attorney, Agent, or Firm*—Ostrolenk, Faber, Gerb & Soffen

[57] ABSTRACT

A compression-assembled device has similar pole pieces which are electrically insulated from one another by an outer insulation ring and, in operation, press against the opposing surfaces of a semiconductor device. The base of the insulation ring is secured to one of the pole pieces, and its other end, and the other pole piece have thin flexible flanges extending from their peripheries and the flanges are connected to one another to mechanically secure the assembly together. One of the flanges has several upturned lips on its circumference which are used to receive and center the other flange. A flexible insulation ring surrounds a semiconductor wafer and locates it between the pole pieces. The ring with the wafer is pressed into the outer insulation ring and thus prevents the wafer from moving within the pole pieces when the pole pieces are not under compression forces.

8 Claims, 13 Drawing Figures

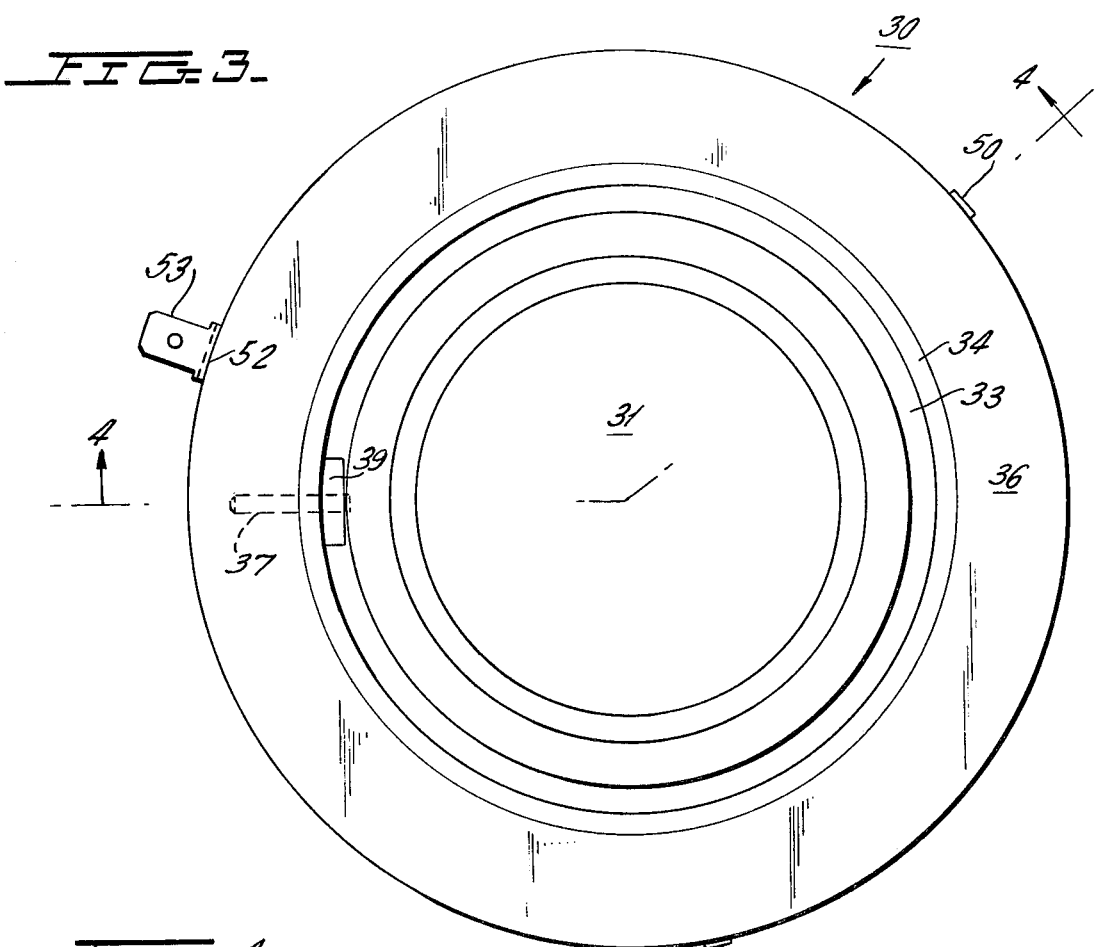
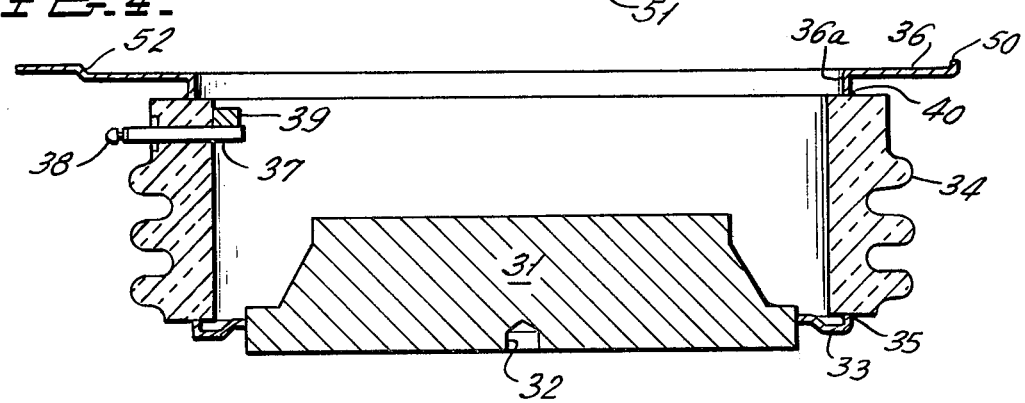
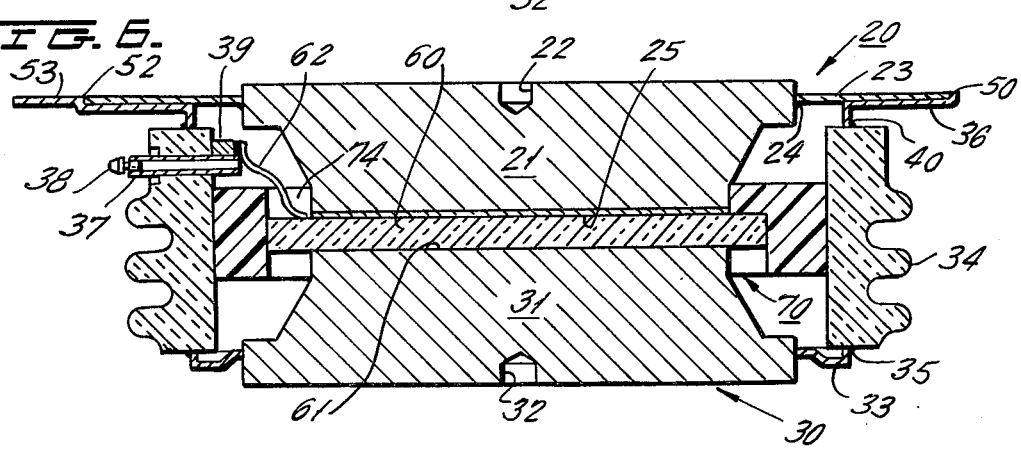

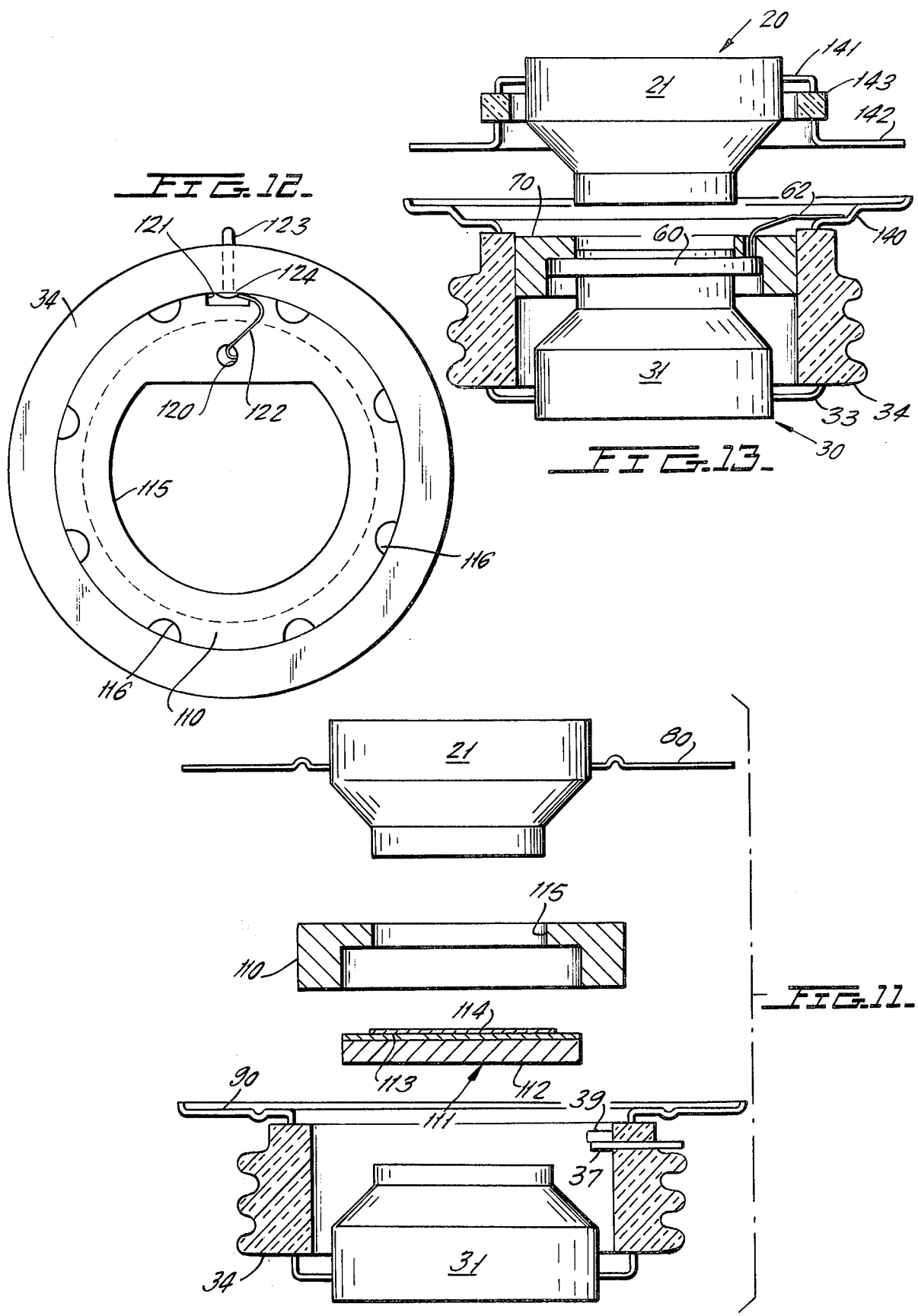

COMPRESSION-ASSEMBLED SEMICONDUCTOR DEVICE WITH NESTING CIRCULAR FLANGES AND FLEXIBLE LOCATING RING

BACKGROUND OF THE INVENTION

This invention relates to compression-assembled semiconductor devices, and more specifically relates to a novel construction for such devices which simplifies the pole piece assembly and which prevents breakage of gate leads due to movement of the semiconductor device within the assembly when the pole pieces are not under compression forces.

Compression-assembled semiconductor devices are well known and are typically shown in U.S. Pat. Nos. 3,452,254 to Boyer, 3,489,957 to DeWarga and 3,681,667 to Kokosa. Devices of this type are used primarily to form semiconductor devices of extremely high power capabilities and which make electrical connection to opposite semiconductor device surfaces by massive opposing pole pieces which bear on the semiconductor device with high pressure.

The advantages and constructional details of these devices are well known in the art. When the semiconductor device in the package has a gate lead as for a thyristor or triac type semiconductor device, the gate lead is a thin, fragile wire which is electrically connected to a gate lead electrode which extends externally of the package, but must not touch the pole pieces.

When the pressure-assembled device is not under high compression forces, the semiconductor device may be relatively loosely held within the package and thus may move or rotate relative to the package when the package is moved or jarred. If this should happen, the gate lead of the device may break or touch one of the pole pieces and the device will not function, or will fail.

One aspect of the present invention deals with a novel manner of immobilizing and centering the semiconductor device within the assembled package even though the package is not subjected to compression loading.

A further problem which is encountered in the manufacture of compression-assembled devices is the need for a configuration which permits the centering of the two relatively massive electrodes relative to one another and relative to the wafer configuration before their cooperating flanges are welded or otherwise secured to one another. Prior art constructions use relatively expensive and complex forming techniques for forming the cooperating circular flanges secured to the electrodes so that they can nest relative to one another when they are assembled, thereby to automatically center their main electrodes relative to one another, with some additional means to center the wafer.

A further aspect of the present invention lies in an inexpensive construction for the flanges which permits the flanges to be easily and properly centered relative to one another during the assembly operation.

The invention is also applicable to rotationally nonsymmetrical wafer configurations with peripheral amplifying gates, and permits rotational alignment of the wafer relative to pole pieces.

BRIEF DESCRIPTION OF THE INVENTION

In accordance with the present invention, a novel shallow cup, or ring of shallow U-shaped cross-section, and of controllably compressible insulation material receives the outer periphery of the flat semiconductor device and has an outer diameter larger than the inside diameter of the enclosure ring. The base of the ring has a smaller opening therein so that both semiconductor device opposing surfaces can be contacted by pole pieces. The base of the ring also has a notch or hole therein which allows safe passage of a gate electrode from the semiconductor device. The ring is further provided with a plurality of notches in its outer wall which permit the ring to be easily compressed into a smaller outer diameter so that it locks the wafer within the package in the desired position between the pole pieces.

In accordance with a second aspect of the invention, the electrodes are centered relative to one another by the provision of inexpensive circumferentially spaced upwardly turned projection portions from the outer diameter of one of the flanges. At least three upturned projections will be spaced around the periphery of the flanges. These projections can extend from either flange and, if desired, some can extend from one flange, and others from the other flange. When all projections extend from only one flange, the opposite flange may be a simple, relatively flat member whose outer diameter is nested between these three or more upwardly turned projections so that the rings and thus the pole pieces are automatically and inexpensively centered relative to one another to simplify the assembly process. The rings are then suitably welded or otherwise connected to one another in a permanent fashion. If desired, one or more of the upwardly projecting centering tips may also have a further extension thereon serving as a point of easy electrical connection to the anode or cathode of the assembled device.

BRIEF DESCRIPTION OF THE DRAWINGS

FIG. 3 is a top view of the other pole piece (the bottom pole piece) along with its preassembled ceramic insulation ring and flange.

FIG. 4 is a cross-section view of FIG. 3 taken across the section line 4—4 in FIG. 3.

FIG. 6 is a cross-sectional view of the assembly of the components of FIGS. 1 through 5 along with a semiconductor device wafer locked in the package by the locating ring and aligned between the opposing pole pieces.

FIG. 11 is an exploded schematic view showing the arrangement of the various components of an assembly which incorporates the upper and lower housings of FIGS. 9 and 10 and which uses a modified flexible insulation ring.

FIG. 12 is a cross-sectional view through an assembly of components of the type shown in FIG. 11 and illustrates the configuration of the flexible insulation ring.

FIG. 13 is a cross-sectional view illustrating the manner in which the novel invention may be applied to a package using two insulation rings for both the upper and lower housing assemblies.

DETAILED DESCRIPTION OF THE DRAWINGS

Figure 1:
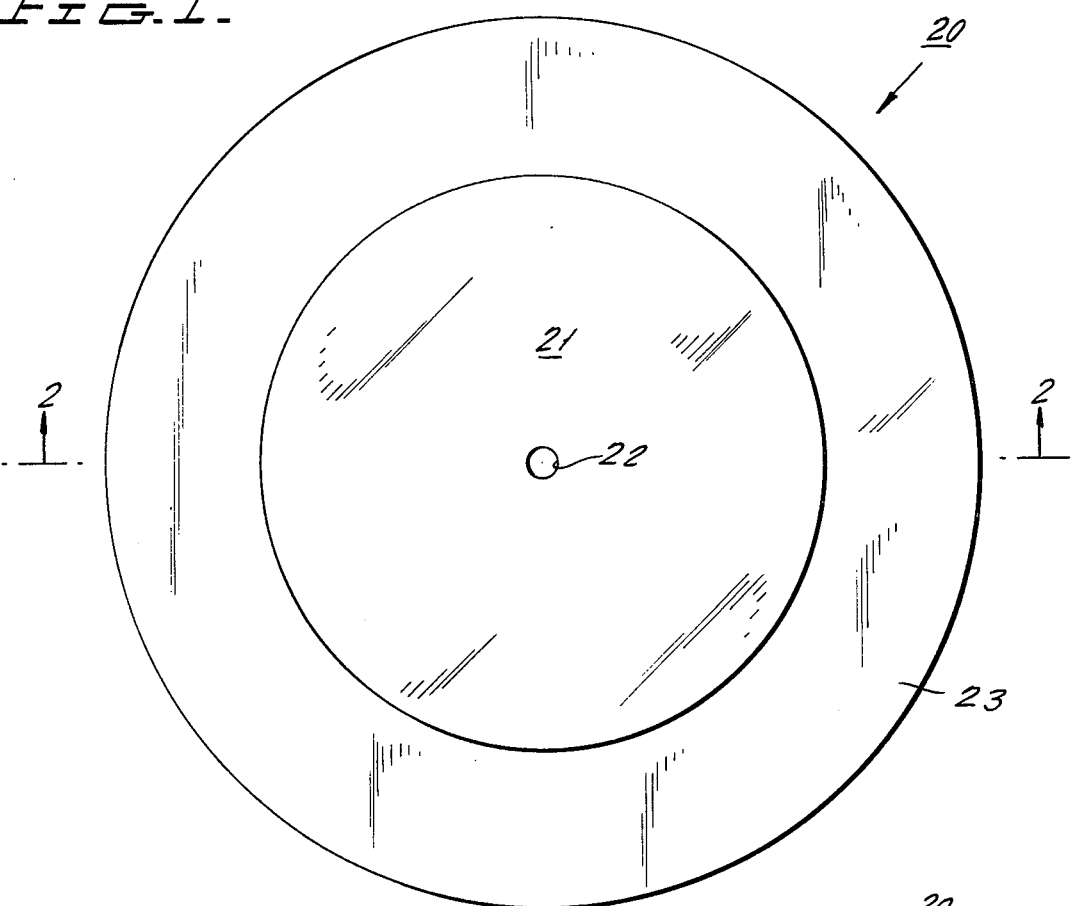
FIG. 1 is a top view of one pole piece (the upper pole piece) and its circular flange.
Figure 2:
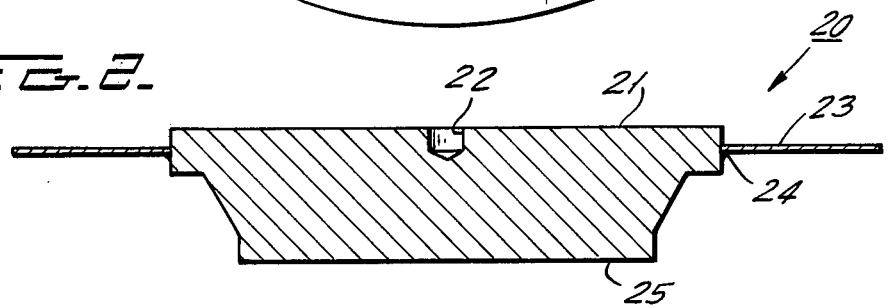
FIG. 2 is a cross-sectional view of FIG. 1 taken across the section line 2—2 in FIG. 1.

Referring first to FIGS. 1 and 2, there is shown therein the upper housing 20 of the compression-assembled device of the present invention where the upper housing 20 consists of a central copper pole piece 21 having a centering opening 22 therein and a flexible conductive flange 23 of relatively thin material which is brazed to the outer periphery of pole piece 21 by the braze ring 24 (FIGS. 2 and 6). The bottom surface 25 of pole piece 21 is smooth and flat and is engageable with the upper surface of a semiconductor device and a locating ring as will be later described in connection with FIG. 6.

The lower housing assembly 30 is shown in FIGS. 3, 4, and 6 and consists of a conductive pole piece 31 which is basically similar to the pole piece 21 and has a centering opening 32 therein. The pole piece 31 has its outer periphery connected to a thin flexible flange 33 and the flange 33 is appropriately brazed in any desired manner to the pole piece 31.

A circular insulating cylinder 34, which may have a corrugated outer surface to increase the electrical creepage distance along the outside of cylinder 34, has its upper and lower surfaces appropriately metalized and its lower surface is brazed to the upwardly turned end of flange 33 by the braze ring 35. The upper surface of cylinder 34 is then connected to flange 36 by the braze ring 40 where the flange 36 is constructed in accordance with one of the aspects of the present invention.

Figure 5:
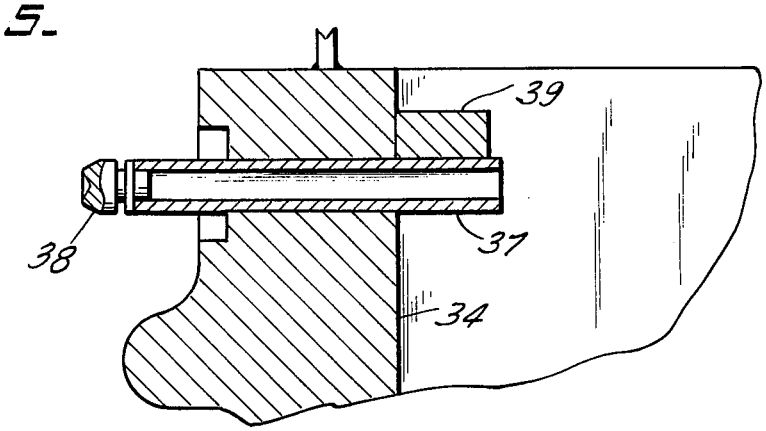
FIG. 5 is an enlarged view of the gate lead connection tube which extends through the circular ring in FIGS. 4 and 5.

It will be noted that the cylinder 34 has a conductive tube 37 extending through its wall, where the tube 37 is sealed at its outer end by the conductive plug 38. The tube 37 permits the evacuation of the interior of the assembled device and the filling of the interior with an inert gas, if desired, after the assembly package is secured together. The tube is plugged with the plug 38 after the interior of the assembled device is gas-filled. Thereafter, the tube 37 may serve as a gate lead connection point which extends externally of the cylinder 34. Note that a small conductive bar 39 shown in detail in FIGS. 3 and 5 can be soldered or brazed to the top of tube 37 to present a relatively large mass of metal such as nickel-plated copper which can receive, as by ultrasonic bonding, the aluminum gate lead of the device which is assembled within the pressure-assembled housing.

The upper surface of cylinder 34 then receives the downwardly turned portion 36a of flange 36 which is secured thereto. In accordance with one aspect of the invention, the flange 36 is provided with short, upturned circumferentially displaced sections or protrusions including upturned sections 50 (FIGS. 3, 4, and 6), 51 (FIG. 3), and 52 (FIGS. 3, 4, and 6). Note that upwardly turned section 52 is simply the upwardly turned portion of an outwardly bent tab 53. Tab 53 may serve as the connection terminal for a control connection or the like to the pole piece 21 when the package is welded together.

Note that more than three upwardly turned portions 50, 51, and 52 could have been used if desired. These upwardly turned regions then serve as centering protrusions for centering the simple, flat flange 23 of the upper pole piece housing 20 when the pole pieces are assembled relative to one another. Note further that the diameter of flange 23 is approximately equal to the diameter formed by a circle which includes upwardly turned sections 50, 51, and 52.

The assembled upper housing 20 and lower housing 30 is shown in FIG. 6 with a semiconductor wafer 60 and locating ring. Thus, the surface 25 of pole piece 21 is engageable with the upper surface of device 60 while a similar polished surface 61 of pole piece 31 engages the lower surface of semiconductor device 60. Note that a gap may exist, as shown, between pole piece 21 and wafer 60 in the uncompressed package without danger of mislocating the wafer 60 relative to pole pieces 21 and 31, as will be later described.

The semiconductor device 60 may be of any desired type and could, for example, be a thyristor wafer, or a triac wafer or the like, and may have a gate lead 62 extending therefrom. The gate lead 62 is usually a thin, fragile wire, and is subject to breakage if the wafer 60 moves even slightly within the housing and between pole pieces 21 and 31 when these members are not compression loaded.

Figure 7:
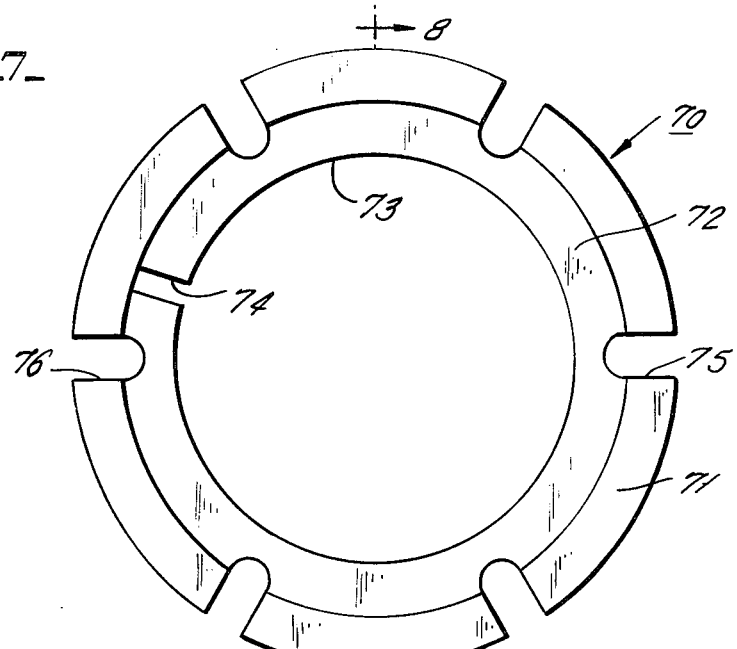
FIG. 7 is a top view of the novel flexible insulation ring of the invention.
Figure 8:
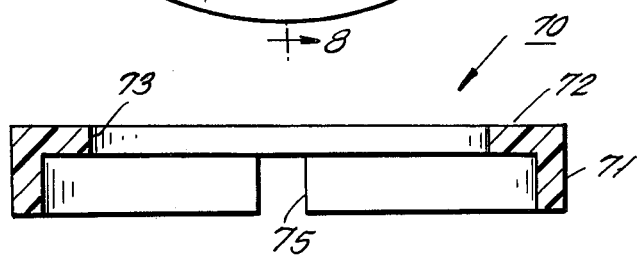
FIG. 8 is a cross-sectional view of the flexible insulation ring of FIG. 7 taken across the section line 8—8 in FIG. 7.

In accordance with a further aspect of the invention, a novel compressible insulation ring shown as the ring 70 in FIGS. 6, 7, and 8 is provided where the ring is comprised of a relatively flexible insulation material such as RTV or silicone rubber. The ring 70 has a cylindrical wall 71 and a disk-shaped bottom region 72 that has an opening 73 therethrough.

The interior diameter of the wall 71 is chosen to be approximately equal to the outer diameter of wafer 60 so that the wafer 60 can be nested within the ring 70 before its assembly. The outer diameter of wall 71 is chosen to be greater than the inner diameter of cylinder 34 to allow the forcefitting of the ring 70 relative to cylinder 34. Importantly, the base 72 has a slot or hole 74 therein through which the gate lead 62 may pass. The ring 70 is further provided with cutout notches 75 which permit easy compression of the ring when the wafer is assembled between the pole pieces 21 and 31. Notches 75 also allow correction for non-uniformities in the dimensions of the packages, provides space for expansion of ring 70 at elevated temperatures without causing vertical deformation, and allows for a uniform inside gas pressure at all temperatures within the package.

During the assembly of the device, the wafer 60 is first loaded into the ring 70 in the manner shown in FIG. 6. Note that the interior diameter of opening 73 is contoured to receive the pole piece 21 so that the pole piece 21 can engage the upper surface of device 60 in the desired manner. The wafer 60 and ring 70 are then pressed into the cylinder 34 atop pole piece 31 and the free end of gate lead 62 is soldered or bonded to conductive bar 39. Thereafter, the upper housing 20 is fitted on top of the lower housing 30 so that the two assemblies are automatically centered relative to one another by the nesting of flange 23 into the upwardly turned protrusions 50, 51, and 52 of flange 36 and rotationally aligned, if desired, by the opening 73. A suitable resistance weld or the like is then made around the engaging peripheries of flanges 23 and 36 to secure the flanges together and to seal them relative to one another.

Note that after welding the wafer remains firmly locked in the desired location relative to both pole piece surfaces regardless of the axial displacement of the pole pieces such as experienced under compression and decompression. This will then prevent the accidental movement or rotation of semiconductor device 60 relative to pole pieces 21 and 31 and to cylinder 34 which could cause the accidental breakage of gate lead 62 or other related failure.

In FIGS. 1 and 2 the flange 23 is shown as a relatively flat metallic member. If desired, the flange 23 can take the form of the flange 80 shown in the embodiment of FIG. 9. Thus, in FIG. 9, the upper housing assembly 20 consists of the upper pole piece 21 but the flange 80 is a relatively thin downwardly dished member with a convolution 81 near the point at which it is joined to the pole piece 21. This configuration imparts greater flexibility to the flange than the flange 23 of FIGS. 1 and 2. Note that the flange region 82 is still relatively flat and lies in a disk-shaped plane so that it can be flushly received by the flange 36 in FIG. 6.

Figure 9:
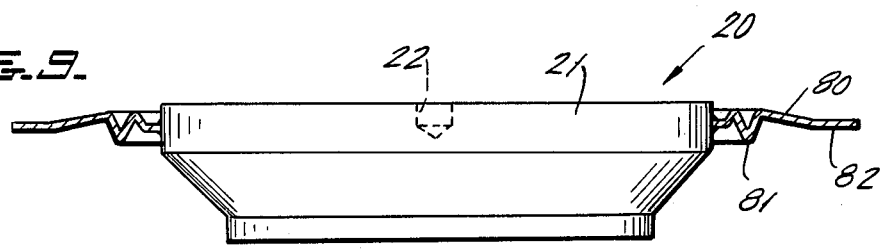
FIG. 9 is a partial cross-sectional view similar to FIG. 2 of a second embodiment of the upper housing assembly having a modified flange configuration for flexibility under applied external pressures on the pole pieces.
Figure 10:
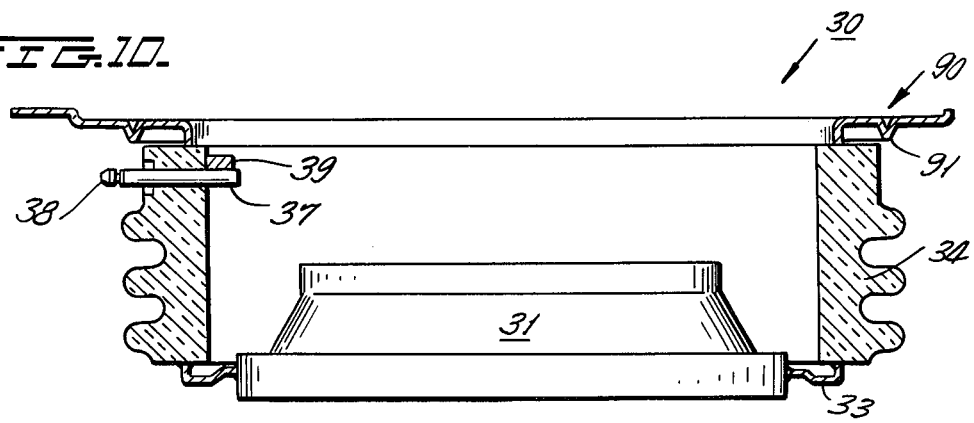
FIG. 10 is a partial cross-sectional view similar to FIG. 4 of a second embodiment of the lower housing assembly having a modified flange configuration with flexible flange and flange projections for centering the pole pieces.

FIG. 10 shows a second embodiment of the invention for the construction of the flange 90 of the lower housing 30. In FIG. 10 the flange 90 replaces the flange 36 of FIGS. 3, 4, and 6 and is provided with a deeply dished convolution 91 which imparts greater flexibility to the flange as compared to its counterpart flange 36 in FIGS. 3, 4, and 6. Note that either of flanges 80 or 90 of FIGS. 9 and 10 could be used with one another or with the cooperating flanges 23 and 36 of FIG. 6 as desired.

FIGS. 11 and 12 illustrate the manner in which the pole pieces 21 and 31 of FIGS. 9 and 10 can be incorporated into an assembly, and further illustrates the manner in which the flexible locating ring can be modified to the shape of the locating ring 110 for use in connection with a silicon wafer assembly 111 (FIG. 11) which is of a type having a non-symmetrical cathode configuration and peripheral amplifying gates, such as a device of the type disclosed in U.S. Pat. No. 3,586,927, in the name of Roach et al., assigned to the assignee of the present invention.

In the assembly of FIG. 11, the wafer assembly 111 comprises a bottom metallic support disk 112, a thin silicon wafer 113, a cathode contact 114, as well as appropriate control contacts which are not shown in FIG. 11. The assembly 111 is then received by the flexible locating ring 110 which has a configuration best shown in FIG. 12 wherein the central opening 115 has the non-symmetric configuration shown to correspond to the non-symmetrical configuration of the cathode contact 114 and of the pole piece 21 which is to make contact with the cathode contact 114. The ring 110 will have the cutout sections, such as cutout 116 in its periphery to enable the ring to fit snugly within the interior diameter of the ceramic insulation ring 34.

The ring 110, in accordance with the embodiments of FIGS. 11 and 12, is further provided with openings 120 and 121 which permit passage of the gate lead 122 and which provides access of gate tube 123 to a gate bar 124 on the silicon wafer 113.

FIG. 13 shows a further embodiment of the invention wherein both the upper and lower housing assemblies are provided with insulation rings. In the following description, components which are identical to those of FIGS. 6 and 11 have been given similar identifying numerals. Thus, it will be noted that the lower pole piece assembly 30 is substantially identical to that of FIG. 4 except that the ring 34 does not contain a gate pin. Conversely, the flange 140 secured to the upper end of ring 34 has a modified configuration to increase its flexibility and the gate lead 62 is bonded to the flange 140 before the assembling of the device.

The upper pole piece assembly 20 then consists of the upper pole piece 21 but has a modified flange assembly including flange 141 and flange 142 which are separated from one another by a ceramic disk 143. The ceramic disk 143 is necessary to insulate the flange 140 which is connected to the gate lead 62 from the cathode pole piece 21.

It should be noted that, when the flange 142 is connected to the flange 140, an open gap is formed between the radial interior regions of the flanges so that the bonding area at which gate lead 62 is bonded to flange 140 is undisturbed. Moreover, the reentrant bent form of the flange 140 improves the flexibility of the flange 140 to better permit axial movement of the pole pieces 21 and 31 under compression forces. It should be understood that the modified flange configuration shown in FIG. 13 can be incorporated as desired in the embodiments of FIGS. 6 and 11. Similarly, the arrangement set forth in FIG. 13 could incorporate the wafer and locating ring configurations shown in either FIG. 6 or in FIG. 11.

Although the present invention has been described in connection with a preferred embodiment thereof, many variations and modifications will now become apparent to those skilled in the art. It is preferred, therefore, that the present invention be limited not by the specific disclosures herein but only by the appended claims.

I claim:

1. A compression bonded assembly for a semiconductor device comprising, in combination:
    first and second spaced pole pieces; said first and second pole pieces having respective facing surfaces which are flat and parallel and which are adapted to engage corresponding surfaces of a semiconductor wafer;
    a semiconductor wafer having flat parallel opposing surfaces disposed between and engaging said respective surfaces of said first and second pole pieces;
    an insulation housing ring radially spaced from and concentrically surrounding said first and second pole pieces and enclosing at least the volume between said spaced pole pieces; said insulation housing ring having first and second ends;
    first circular flange ring means extending from said first pole piece and connected to said first end of said insulation housing;
    second circular flange ring means extending from said second pole piece;
    third circular flange ring means extending outwardly from said second end of said insulation housing ring;
    said third flange ring means having substantially the same diameter as said second flange ring means;
    said third flange ring means engaging said second flange ring means in surface-to-surface contact;

at least three discrete bent tabs extending across the outer circumferential peripheries of said second and third flange ring means for centering said second and third flange ring means relative to one another; said at least three bent tabs being circumferentially spaced from one another; each of said at least three bent tabs extending from the same one of said second or third flange ring means, the other of said second or third flange ring means defining a circular disc without extensions thereon.

2. The device of claim 1 wherein at least one of said at least three bent tabs has a radially extending terminal extending therefrom.

3. The device of claim 1 wherein each of said first, second and third flange ring means are relatively flexible.

4. The device of claim 1 wherein said first and second pole pieces are identical to one another.

5. The device of claim 1 wherein said semiconductor wafer has a thin gate lead extending from a surface thereof which is exclusively outside the area of engagement of said wafer by said first and second pole pieces, and wherein said insulation housing ring contains gate lead terminal means extending therethrough and connected to said gate lead.

6. The device of claim 5 which further includes a shallow cup-shaped body of flexible insulation material; said cup-shaped body having an opening in the bottom thereof sufficiently large to receive said first pole piece; said cup-shaped body having a shallow cylindrical wall of diameter sufficiently large to receive said semiconductor wafer; said semiconductor wafer being disposed within and gripped within said cup; and said first pole piece engaging said semiconductor wafer through said opening in the bottom of said cup; at least a portion of the body of said cup being elastically compressed against the interior wall of said insulation housing ring, thereby to prevent accidental movement of said wafer relative to said first and second pole pieces after said second and third flange ring means are joined together.

7. The device of claim 6 wherein said cup-shaped body has a slot in the bottom thereof for receiving said gate lead, and wherein said cup-shaped body has a plurality of notches in its cylindrical wall to assist the elastic compression of said body between said first and second pole pieces.

8. A compression bonded assembly for a semiconductor device comprising, in combination:
first and second spaced pole pieces; said first and second pole pieces having respective facing surfaces which are flat and parallel and which are adapted to engage corresponding surfaces of a semiconductor wafer;
an insulation housing ring radially spaced from and concentrically surrounding said first and second pole pieces and enclosing at least the volume between said spaced pole pieces; said insulation housing ring having first and second ends;
first circular flange ring means extending from said first pole piece and connected to said first end of said insulation housing ring;
second circular flange ring means extending from said second pole piece and connected to said second end of said insulation housing ring;
and a shallow cup-shaped body of flexible insulation material; said cup-shaped body having an opening in the bottom thereof sufficiently large to receive said first pole piece; said cup-shaped body having a shallow cylindrical wall of diameter sufficiently large to receive said semiconductor wafer; said semiconductor wafer being disposed within and gripped within said cup, and said first pole piece engaging said semiconductor wafer through said opening in the bottom of said cup-shaped body; at least a portion of the body of said cup being elastically compressed against the interior wall of said insulation housing ring, thereby to prevent accidental movement of said wafer relative to said first and second pole pieces, said cup-shaped body further having a slot in the bottom thereof for receiving said gate lead, and said cup-shaped body having a plurality of notches in its cylindrical wall to assist the elastic compression of said body between said first and second pole pieces.

* * * * *